United States Patent
Maekawa et al.

(10) Patent No.: US 12,224,549 B2
(45) Date of Patent: Feb. 11, 2025

(54) LINE NARROWING MODULE, GAS LASER APPARATUS, AND METHOD FOR MANUFACTURING ELECTRONIC DEVICES

(71) Applicant: Gigaphoton Inc., Tochigi (JP)

(72) Inventors: Junichi Maekawa, Oyama (JP); Hiroshi Furusato, Oyama (JP)

(73) Assignee: Gigaphoton Inc., Tochigi (JP)

( * ) Notice: Subject to any disclaimer, the term of this patent is extended or adjusted under 35 U.S.C. 154(b) by 236 days.

(21) Appl. No.: 18/167,611

(22) Filed: Feb. 10, 2023

(65) Prior Publication Data

US 2023/0187896 A1 Jun. 15, 2023

Related U.S. Application Data

(63) Continuation of application No. PCT/JP2020/033889, filed on Sep. 8, 2020.

(51) Int. Cl.
| | |
|---|---|
| *H01S 3/137* | (2006.01) |
| *G03F 7/00* | (2006.01) |
| *H01S 3/034* | (2006.01) |
| *H01S 3/08* | (2023.01) |

(Continued)

(52) U.S. Cl.
CPC .......... *H01S 3/137* (2013.01); *G03F 7/70025* (2013.01); *H01S 3/08004* (2013.01); *H01S 3/1305* (2013.01); *H01S 3/034* (2013.01); *H01S 3/225* (2013.01)

(58) Field of Classification Search
CPC .... G03F 7/70025; G03F 7/20; G03F 7/70041; G03F 7/70575; G02B 7/1805; G02B 7/181; H01S 3/036; H01S 3/08004; H01S 3/08009; H01S 3/106; H01S 3/137; H01S 3/225; H01S 3/034; H01S 3/0971; H01S 3/1305; H01S 3/134; H01S 3/2251; (Continued)

(56) References Cited

U.S. PATENT DOCUMENTS

| | | |
|---|---|---|
| 9,130,338 B2 | 9/2015 | Kumazaki et al. |
| 2007/0091488 A1 | 4/2007 | Grapov et al. |
| 2013/0001398 A1 | 1/2013 | Wada et al. |

(Continued)

FOREIGN PATENT DOCUMENTS

| | | |
|---|---|---|
| CN | 102853811 A | 1/2013 |
| CN | 207555348 U | 6/2018 |

(Continued)

OTHER PUBLICATIONS

International Search Report issued in PCT/JP2020/033889; mailed Nov. 24, 2020.

(Continued)

*Primary Examiner* — Deoram Persaud
(74) *Attorney, Agent, or Firm* — Studebaker & Brackett PC

(57) ABSTRACT

A line narrowing module includes an enclosure, a prism which is disposed in an internal space of the enclosure and through which light passes, a mounter which is disposed in the internal space and on which the prism is mounted, a fixing unit which is disposed in the internal space and fixes the prism to the mounter, and a light blocking member. The (Continued)

light blocking member is disposed in the internal space and blocks scattered light in the internal space, the scattered light produced from the light and traveling to the fixing unit.

16 Claims, 12 Drawing Sheets

(51) Int. Cl.
 *H01S 3/13* (2006.01)
 *H01S 3/225* (2006.01)
(58) Field of Classification Search
 CPC ........ H01S 3/08; H01S 3/0805; H01S 3/0809; H01S 3/0826; H01S 3/10069; H01S 3/104
 See application file for complete search history.

(56) References Cited

U.S. PATENT DOCUMENTS

| | | | | |
|---|---|---|---|---|
| 2018/0107017 | A1* | 4/2018 | Mason | G02B 26/007 |
| 2020/0014168 | A1 | 1/2020 | Matsumoto et al. | |
| 2021/0336407 | A1* | 10/2021 | Igarashi | G03F 7/70575 |
| 2022/0385022 | A1* | 12/2022 | Kumazaki | H01S 3/137 |
| 2022/0385027 | A1* | 12/2022 | Kumazaki | G03F 7/20 |
| 2022/0385028 | A1* | 12/2022 | Fujii | H01S 3/104 |
| 2022/0385029 | A1* | 12/2022 | Fujimaki | H01S 3/1305 |
| 2022/0385030 | A1* | 12/2022 | Fujimaki | H01S 3/0826 |
| 2023/0187892 | A1* | 6/2023 | Saito | H01S 3/08009 |
| | | | | 355/71 |

FOREIGN PATENT DOCUMENTS

| | | |
|---|---|---|
| JP | H02-194677 A | 8/1990 |
| JP | H11-233858 A | 8/1999 |
| JP | 2002-048960 A | 2/2002 |
| JP | 2002-374025 A | 12/2002 |
| JP | 2003-195127 A | 7/2003 |
| JP | 2003-249702 A | 9/2003 |
| WO | 2018/198215 A1 | 11/2018 |

OTHER PUBLICATIONS

Written Opinion of the International Searching Authority issued in PCT/JP2020/033889; mailed Nov. 24, 2020.

An Office Action; mailed by the China National Intellectual Property Administration of the People's Republic of China on Sep. 5, 2024, which corresponds to Chinese Patent Application No. 202080103980.1 and is related to U.S. Appl. No. 18/167,611.

* cited by examiner

LINE NARROWING MODULE, GAS LASER APPARATUS, AND METHOD FOR MANUFACTURING ELECTRONIC DEVICES

CROSS-REFERENCE TO RELATED APPLICATIONS

The present application is a continuation application of International Application No. PCT/JP2020/033889, filed on Sep. 8, 2020, the entire contents of which are hereby incorporated by reference.

BACKGROUND

1. Technical Field

The present disclosure relates to a line narrowing module, a gas laser apparatus, and a method for manufacturing electronic devices.

2. Related Art

In recent years, a semiconductor exposure apparatus is required to improve the resolution thereof as semiconductor integrated circuits are increasingly miniaturized and highly integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

The light from spontaneously oscillating KrF and ArF excimer laser apparatuses has a wide spectral linewidth ranging from 350 pm to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] JPH11-233858A
[PTL 2] JPH02-194677A
[PTL 3] U.S. Pat. No. 9,130,338B
[PTL 4] JP2002-374025A

SUMMARY

A line narrowing module according to an aspect of the present disclosure includes an enclosure, a prism which is disposed in an internal space of the enclosure and through which light passes, a mounter which is disposed in the internal space and on which the prism is mounted, a fixing unit which is disposed in the internal space and fixes the prism to the mounter, and a light blocking member which is disposed in the internal space and blocks scattered light in the internal space, the scattered light produced from the light and traveling to the fixing unit.

A gas laser apparatus according to another aspect of the present disclosure includes a line narrowing module, and the line narrowing module includes an enclosure, a prism which is disposed in an internal space of the enclosure and through which light passes, a mounter which is disposed in the internal space and on which the prism is mounted, a fixing unit which is disposed in the internal space and fixes the prism to the mounter, and a light blocking member which is disposed in the internal space and blocks scattered light in the internal space, the scattered light produced from the light and traveling to the fixing unit.

An electronic device manufacturing method according to another aspect of the present disclosure includes causing laser light outputted from a gas laser apparatus including a line narrowing module to enter an exposure apparatus, the line narrowing module including an enclosure, a prism which is disposed in an internal space of the enclosure and through which light passes, a mounter which is disposed in the internal space and on which the prism is mounted, a fixing unit which is disposed in the internal space and fixes the prism to the mounter, and a light blocking member which is disposed in the internal space and blocks scattered light in the internal space, the scattered light produced from the light and traveling to the fixing unit, and causing a light sensitive substrate to be exposed to the laser light in the exposure apparatus to manufacture electronic devices.

BRIEF DESCRIPTION OF THE DRAWINGS

Embodiments of the present disclosure will be described below only by way of example with reference to the accompanying drawings.

DETAILED DESCRIPTION

Figure 1:
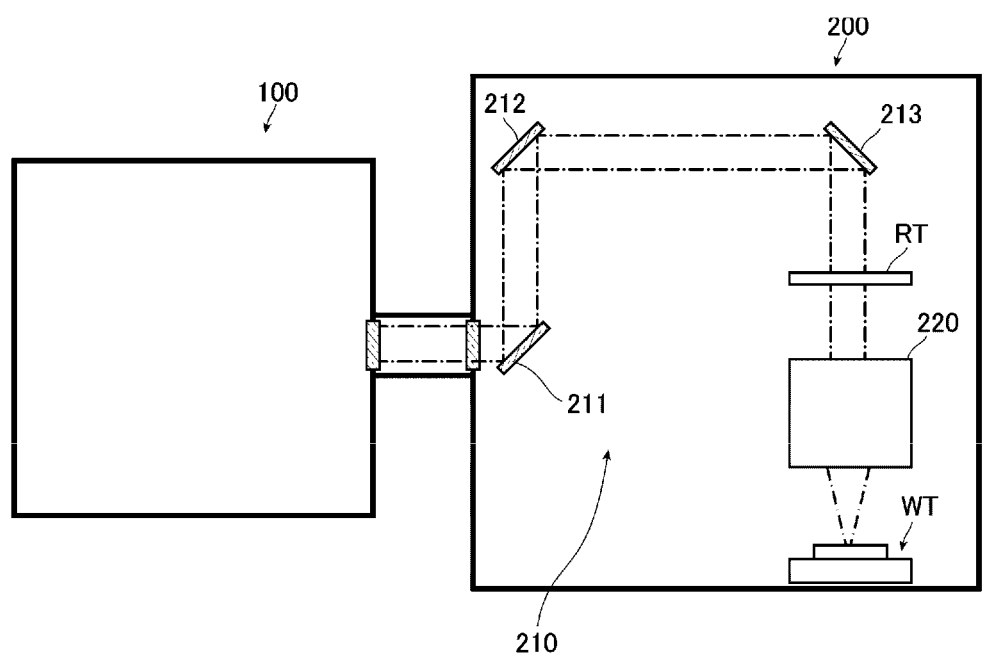
FIG. 1 is a diagrammatic view showing a schematic configuration example of an entire electronic device manufacturing apparatus.

1. Description of electronic device manufacturing apparatus used in electronic device exposure step
2. Description of gas laser apparatus according to Comparative Example
 2.1 Configuration
 2.2 Operation
 2.3 Problems
3. Description of line narrowing module in first embodiment
 3.1 Configuration
 3.2 Effects and advantages
4. Description of line narrowing module according to second embodiment
 4.1 Configuration
 4.2 Effects and advantages Embodiments of the present disclosure will be described below in detail with reference to the drawings.

The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no redundant description of the same component will be made.

1. Description of Electronic Device Manufacturing Apparatus Used in Electronic Device Exposure Step FIG. 1 is a diagrammatic view showing a schematic configuration example of an entire electronic device manufacturing apparatus used in an electronic device exposure step. The manufacturing apparatus used in the exposure step includes a gas laser apparatus 100 and an exposure apparatus 200, as shown in FIG. 1. The exposure apparatus 200 includes an illumination optical system 210, which includes a plurality of mirrors 211, 212, and 213, and a projection optical system 220. The illumination optical system 210 illuminates a reticle pattern on a reticle stage RT with laser light having entered the exposure apparatus 200 from the gas laser apparatus 100. The projection optical system 220 performs reduction projection on the laser light having passed through the reticle to bring the laser light into focus on a workpiece that is not shown but is placed on a workpiece table WT. The workpiece is a light sensitive substrate onto which a photoresist has been applied, such as a semiconductor wafer. The exposure apparatus 200 translates the reticle stage RT and the workpiece table WT in synchronization with each other to expose the workpiece to the laser light having reflected the reticle pattern. Semiconductor devices that are electronic devices can be manufactured by transferring a device pattern onto the semiconductor wafer in the exposure step described above.

2. Description of Gas Laser Apparatus According to Comparative Example 2.1 Configuration The gas laser apparatus 100 according to Comparative Example will be described. Comparative Example in the present disclosure is a form that the applicant is aware of as known only by the applicant, and is not a publicly known example that the applicant is self-aware of.

Figure 2:
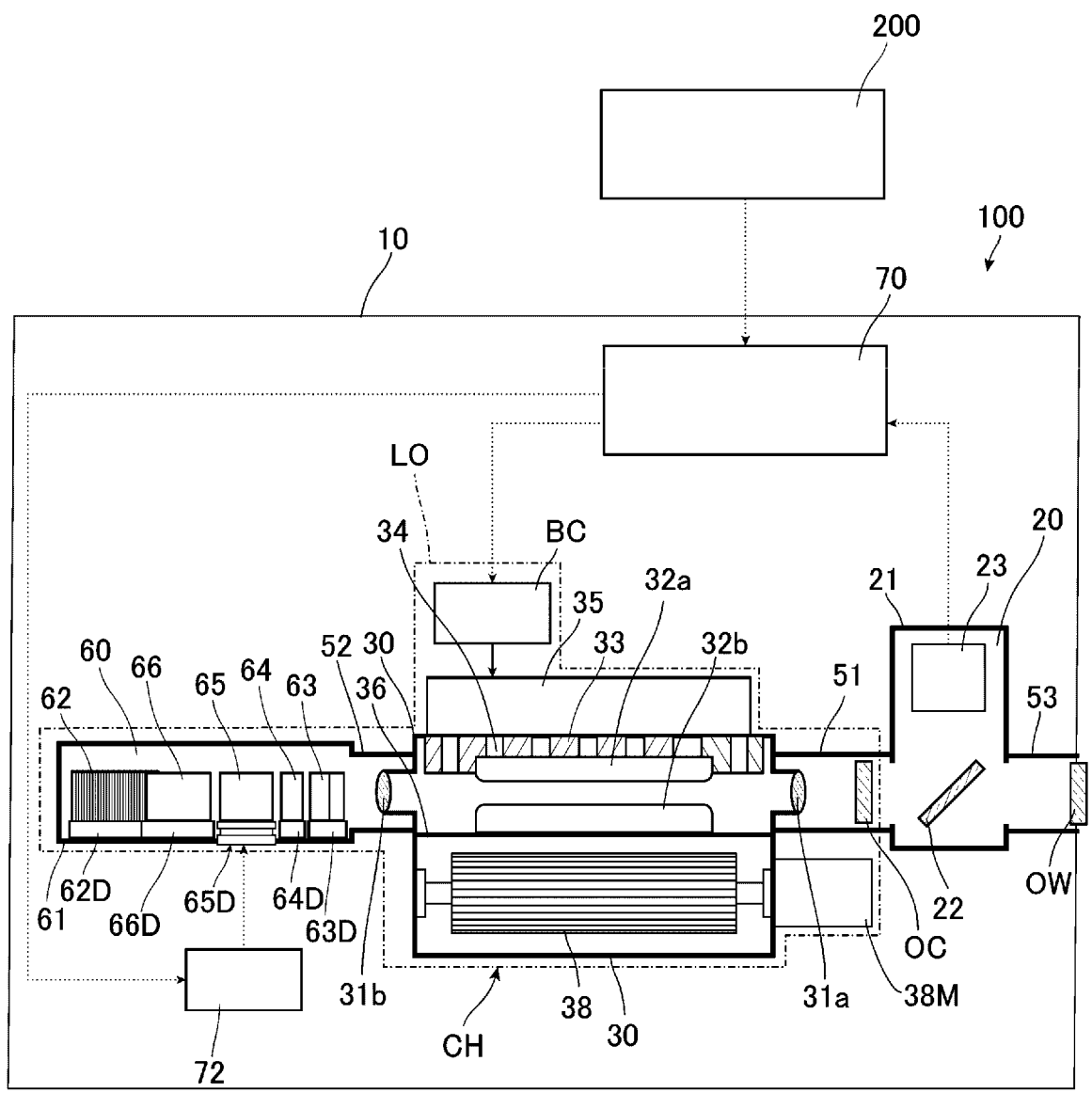
FIG. 2 is a diagrammatic view showing a schematic configuration example of an entire gas laser apparatus.

FIG. 2 is a diagrammatic view showing a schematic configuration example of the entire gas laser apparatus 100 according to Comparative Example. The gas laser apparatus 100 according to Comparative Example includes an enclosure 10, a laser oscillator LO, a wavelength measuring module 20, and a processor 70 as primary components, as shown in FIG. 2. The gas laser apparatus 100 according to Comparative Example is an ArF excimer laser apparatus using a mixture gas containing, for example, argon (Ar), fluorine ($F_2$), and neon (Ne). In this case, the gas laser apparatus 100 outputs pulse laser light having a center wavelength of about 193 nm. The gas laser apparatus 100 may instead be a gas laser apparatus other than an ArF excimer laser apparatus, for example, a KrF excimer laser apparatus using a mixture gas containing krypton (Kr), fluorine ($F_2$), and neon (Ne). In this case, the gas laser apparatus 100 outputs pulse laser light having a center wavelength of about 248 nm. The mixture gas containing Ar, $F_2$, and Ne and the mixture gas containing Kr, $F_2$, and Ne, the constituent elements forming a laser medium, are each referred to as a laser gas in some cases.

The processor 70 in the present disclosure is a processing apparatus including a storage apparatus that stores a control program, and a CPU that executes the control program. The processor 70 is particularly configured or programmed to carry out a variety of processes contained in the present disclosure. The processor 70 controls some of the components of the gas laser apparatus 100. The processor 70 further controls the entire gas laser apparatus 100.

The laser oscillator LO includes a chamber apparatus CH, a charger BC, a line narrowing module 60, and an output coupling mirror OC as primary components.

The chamber apparatus CH includes an enclosure 30, a pair of windows 31a and 31b, a pair of electrodes 32a and 32b, an insulating section 33, a pulse power module 35, an electrode holder 36, a crossflow fan 38, and a motor 38M as primary components.

The windows 31a and 31b are provided in the enclosure 30 in positions facing each other. The window 31a is located at one end of the enclosure 30 in the traveling direction of the laser light, and the window 31b is located at the other end of the enclosure 30 in the traveling direction of the laser light. The gas laser apparatus 100 outputs the laser light as a result of optical oscillation that occurs on the optical path on which the enclosure 30 is disposed, so that the laser light generated in an internal space of the enclosure 30 exits out of the enclosure 30 via the windows 31a and 31b, as will be described later. The windows 31a and 31b are each tilted to form a Brewster angle with respect to the traveling direction of the laser light so that reflection of P-polarized component of the laser light that occurs thereat is suppressed. The window 31a may be fitted into a hole in the enclosure 30 or held by a tubular holder. When the window 31a is held by the holder, one end of the holder is connected to the wall surface of the enclosure 30, the hollow section of the holder communicates with the hole in the enclosure 30, and the window 31a is disposed at the surface at the other end of the holder so as to face the hollow section. The window 31b may be fitted into a hole in the enclosure 30 or held by a tubular holder, as the window 31a is.

The enclosure 30 has the internal space where the laser gas described above is excited to generate light. The laser gas is supplied to the internal space of the enclosure 30 from a laser gas supply source that is not shown but is located in the enclosure 10 via a pipe that is not shown. In Comparative Example, since the gas laser apparatus 100 is an ArF excimer laser apparatus, the laser gas supply source supplies, for example, the mixture gas containing Ar, $F_2$, and Ne to the internal space of the enclosure 30. When the gas laser apparatus 100 is a KrF excimer laser apparatus, the laser gas supply source supplies, for example, the mixture gas containing Kr, $F_2$, and Ne to the internal space of the enclosure 30. The light described above, which has been generated by the excitation of the laser gas, travels to the windows 31a and 31b.

The longitudinal direction of the pair of electrodes 32a and 32b extends along the traveling direction of the laser light, and the pair of electrodes 32a and 32b are arranged so as to face each other in the internal space of the enclosure 30. The space between the electrodes 32a and 32b in the enclosure 30 is sandwiched between the windows 31a and 31b. The electrodes 32a and 32b are each a discharge electrode that produces glow discharge that excites the laser medium. In Comparative Example, the electrode 32a is the cathode, and the electrode 32b is the anode.

An opening is formed in the enclosure 30, and the opening is closed by the insulating section 33 including an insulator. The electrode 32a is supported by the insulating section 33. A feedthrough section 34 formed of a conductive member is buried in the insulating section 33. The feedthrough section 34 applies a voltage supplied from the pulse power module 35 to the electrode 32a. The electrode 32b is supported by the electrode holder 36 and electrically connected to the electrode holder 36. The electrode holder 36 is electrically connected to the enclosure 30 via wiring that is not shown.

The charger BC disposed outside the enclosure 30 is connected to the pulse power module 35. The charger BC is a DC power supply that uses a predetermined voltage to charge a capacitor that is not shown but is provided in the pulse power module 35. The pulse power module 35 includes a switch controlled by the processor 70. When the switch in the off state is changed to the on state, the pulse power module 35 boosts the voltage applied from the charger BC to generate a pulse-shaped high voltage and applies the high voltage to the pair of electrodes 32a and 32b.

The crossflow fan 38 is disposed in the internal space, of the enclosure 30, that is on a side across the electrode holder 36 from the electrode 32b. The space, in the internal space of the enclosure 30, where the crossflow fan 38 is disposed communicates with the space between the pair of electrodes 32a and 32b in the internal space of the enclosure 30. The laser gas encapsulated in the internal space of the enclosure 30 therefore circulates in a predetermined direction when the crossflow fan 38 rotates. The motor 38M disposed outside the enclosure 30 is connected to the crossflow fan 38. The rotation produced by the motor 38M rotates the crossflow fan 38. The motor 38M is turned on and off and the rotational speed thereof is adjusted under the control of the processor 70. The processor 70 can therefore adjust the circulation speed of the laser gas circulating in the internal space of the enclosure 30 by controlling the motor 38M.

A heat exchanger that is not shown is disposed next to the crossflow fan 38. At least part of the laser gas circulated by the crossflow fan 38 passes through the heat exchanger, which adjusts the temperature of the laser gas.

An optical path tube 51 is connected to the one end of the enclosure 30, which is the end where the window 31a is provided. The output coupling mirror OC is provided on the side facing the one end of the enclosure 30 as a reference and disposed in an internal space of the optical path tube 51. The output coupling mirror OC is an optical element on which the laser light that exits via the window 31a is incident. The output coupling mirror OC transmits part of the light that exits via the window 31a and reflects the other part of the light back into the internal space of the enclosure 30 via the window 31a. The output coupling mirror OC is formed, for example, of an element including a calcium fluoride substrate on which a dielectric multilayer film is deposited. A film that partially reflects the laser light may be deposited on the surface of the output coupling mirror OC.

An optical path tube 52 is connected to the other end, of the enclosure 30, where the window 31b is provided. The line narrowing module 60 is connected to the optical path tube 52. The line narrowing module 60 is therefore provided at the other end described above of the enclosure 30 as the reference, that is, at the side across the enclosure 30 from the output coupling mirror OC. The line narrowing module 60 includes an enclosure 61, a grating 62, and prisms 63, 64, 65, and 66.

Figure 3:
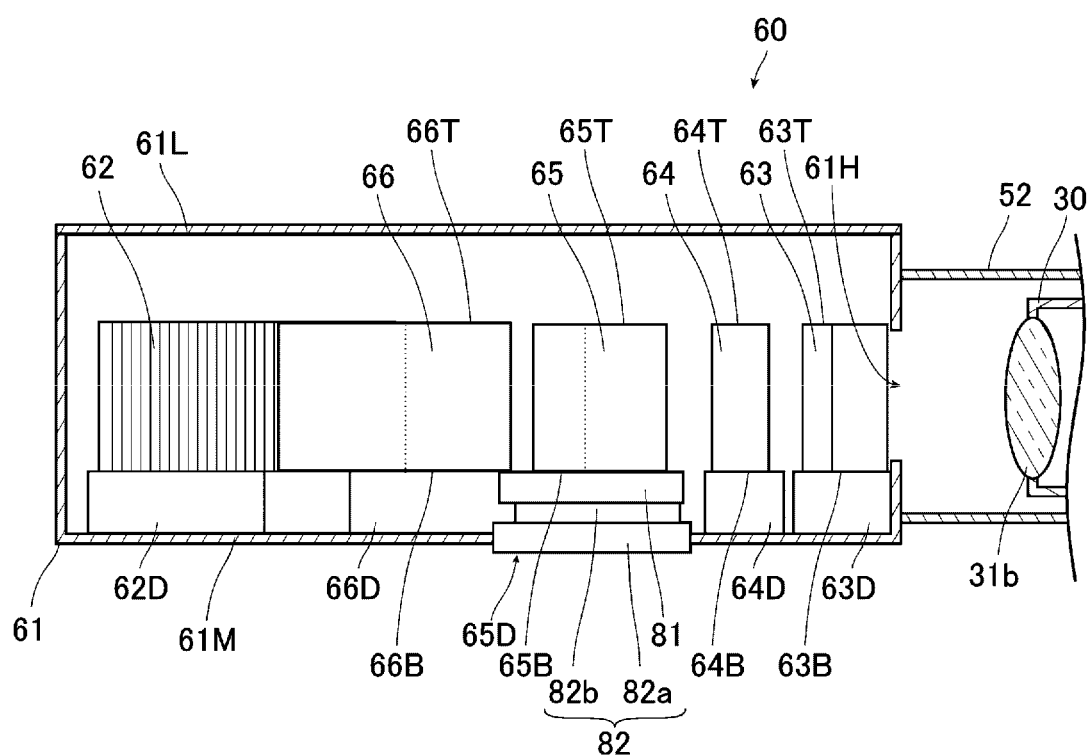
FIG. 3 is an enlarged view of a line narrowing module shown in FIG. 2.
Figure 4:
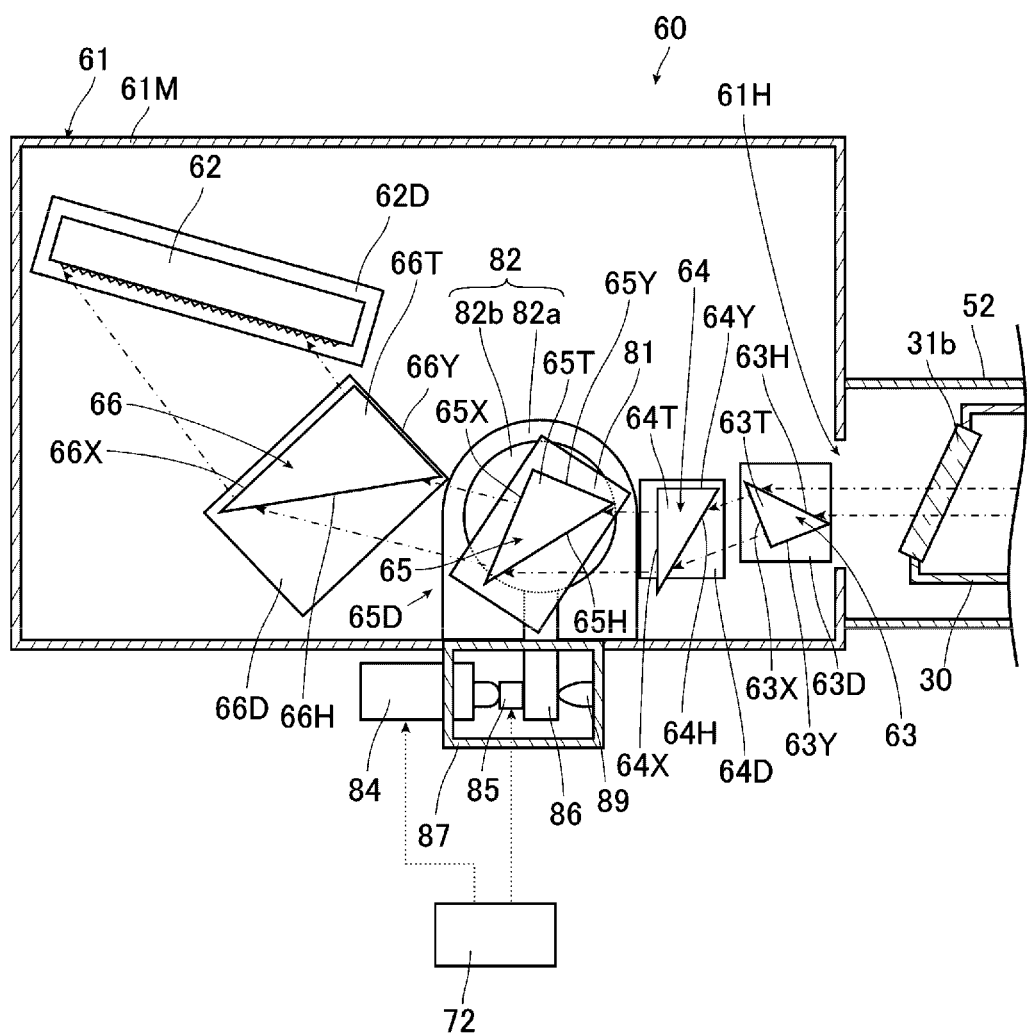
FIG. 4 shows an internal space of an enclosure of the line narrowing module shown in FIG. 3, viewed from the side facing a lid section of the enclosure toward a bottom surface of the enclosure on a side across the internal space from the lid section.

FIG. 3 is an enlarged view of the line narrowing module 60 shown in FIG. 2. FIG. 4 shows an internal space of the enclosure 61 shown in FIG. 3, viewed from the side facing a lid section 61L of the enclosure 61 toward the bottom surface, of the enclosure 61, on the side across the internal space from the lid section 61L. The direction from the lid section 61L toward the bottom surface is the direction from the electrode 32a toward the electrode 32b. The enclosure 61 includes a body section 61M and the lid section 61L, which closes the top of the body section 61M. An opening 61H is formed in a side surface of the body section 61M, and the internal space of the enclosure 61 and an internal space of the optical path tube 52 communicate with each other via the opening 61H.

The grating 62 and the prisms 63, 64, 65, and 66 are disposed in the internal space of the enclosure 61. The grating 62 and the prisms 63, 64, 65, and 66 are optical elements on which the laser light that exits via the window 31b is incident. The grating 62 is disposed in the Littrow arrangement, which causes the angle of incidence of the laser light incident on the grating 62 to be substantially equal to the angle of diffraction of the light diffracted by the grating 62. In Comparative Example, the grating 62 may instead be an echelle grating blazed with respect to the wavelength of about 193.4 nm. The grating 62 is fixed to a mounter 62D, and the mounter 62D is fixed to the enclosure 61. The grating 62 therefore does not move relative to the enclosure 61.

The prisms 63, 64, 65, and 66 in Comparative Example each have a triangular columnar shape, specifically, a right-angled triangular columnar shape having a right-angled triangular bottom surface. The prism 63 has a pair of bottom surfaces 63B and 63T, and side surfaces 63H, 63X, and 63Y perpendicular to the bottom surfaces 63B and 63T. The side surface 63H has sides that coincide with the oblique sides of the bottom surfaces 63B and 63T, and the side surfaces 63X and 63Y are perpendicular to each other. The prism 64 has a pair of bottom surfaces 64B and 64T, and side surfaces 64H, 64X, and 64Y perpendicular to the bottom surfaces 64B and 64T. The side surface 64H has sides that coincide with the oblique sides of the bottom surfaces 64B and 64T, and the side surfaces 64X and 64Y are perpendicular to each other. The prism 65 has a pair of bottom surfaces 65B and 65T, and side surfaces 65H, 65X, and 65Y perpendicular to the bottom surfaces 65B and 65T. The side surface 65H has sides that coincide with the oblique sides of the bottom surfaces 65B and 65T, and the side surfaces 65X and 65Y are perpendicular to each other. The prism 66 has a pair of bottom surfaces 66B and 66T, and side surfaces 66H, 66X, and 66Y perpendicular to the bottom surfaces 66B and 66T. The side surface 66H has sides that coincide with the oblique sides of the bottom surfaces 66B and 66T, and the side surfaces 66X and 66Y are perpendicular to each other. The side surfaces 63H, 64H, 65H, and 66H are each coated with a film that suppresses reflection of the P-polarized component of the laser light traveling from the space outside the prism to the side surface. The side surfaces 63X, 64X, 65X, and 66X and the side surfaces 63Y, 64Y, 65Y, and 66Y are each coated with a film that suppresses reflection of the laser light traveling from the space outside the prism to the side surface. The films may each contain at least one of $SiO_2$, $MgF_2$, $LaF_3$, and $GdF_3$. It is particularly preferable that the material of the films is a UV-resistant, fluoride-based material. It is further preferable that the material of the films is cognate with the material of the prisms 63, 64, 65, and 66.

The prisms 63, 64, 65, and 66 are made, for example, of calcium fluoride. The prisms 63, 64, 65, and 66 each have a light incident side surface on which light is incident and a light exiting side surface via which the incident light exits, disperse the light incident via the light incident side surface in terms of wavelength, and cause the dispersed light to exit via the light exiting side surface. In Comparative Example, the light propagating from the chamber apparatus CH enters the prisms 63, 64, 65, and 66 via the side surfaces 63H, 64H, 65H, and 66H. The light incident via the side surfaces 63H, 64H, 65H, and 66H exits via the side surfaces 63X, 64X, 65X, and 66X of the respective prisms 63, 64, 65, and 66. Therefore, as the side surfaces that transmit the light incident from the chamber apparatus CH, the side surfaces 63H, 64H, 65H, and 66H serve as the light incident side surfaces, and the side surfaces 63X, 64X, 65X, and 66X serve as the light exiting side surfaces. Conversely, the light propagating from the grating 62 enters the prisms 66, 65, 64, and 63 via the side surfaces 66X, 65X, 64X, and 63X. The light incident via the side surfaces 66X, 65X, 64X, and 63X exits out of the respective prisms 66, 65, 64, and 63 via the side surfaces 66H, 65H, 64H, and 63H. Therefore, as the side surfaces that transmit the light propagating from the grating 62, the side surfaces 66X, 65X, 64X, and 63X serve as the light incident side surfaces, and the side surfaces 66H, 65H, 64H, and 63H serve as the light exiting side surfaces.

In Comparative Example, the prism 63 is fixed to a mounter 63D with one bottom surface 63B of the prism 63 facing the mounter 63D, as shown in FIG. 3. The prism 64 is fixed to a mounter 64D with one bottom surface 64B of the prism 64 facing the mounter 64D. The prism 66 is fixed to a mounter 66D with one bottom surface 66B of the prism 66 facing the mounter 66D. The mounters 63D, 64D, and 66D are fixed to the enclosure 61. The prisms 63, 64, and 66 therefore do not move relative to the enclosure 61 or the grating 62. On the other hand, the prism 65 is fixed to a mounter 65D. The mounter 65D slightly rotates the prism 65 around an axis perpendicular to the dispersion plane of the light that exits out of the prism 65. The mounter 65D will be described later in detail. The bottom surface 63T of the prism 63 is the other surface on the side of the prism 63 opposite from the one bottom surface 63B mounted on the mounter 63D. The bottom surface 64T of the prism 64 is the other surface on the side of the prism 64 opposite from the one bottom surface 64B mounted on the mounter 64D. The bottom surface 65T of the prism 65, one bottom surface 65B of which is mounted on the mounter 65D, is the other surface on the side of the prism 65 opposite from the one bottom surface 65B. The bottom surface 66T of the prism 66 is the other surface on the side of the prism 66 opposite from the one bottom surface 66B mounted on the mounter 66D.

When the prism 65 slightly rotates to change the orientation thereof, the direction of the light that exits out of the prism 65 changes, so that the angle of incidence of the light to be incident on the grating 62 is adjusted. Adjusting the angle of incidence of the light incident on the grating 62 adjusts the wavelength of the light reflected off the grating 62 and entering the chamber apparatus CH. The wavelength of the light that enters the enclosure 30 is therefore adjusted to a desired wavelength when the light that exits via the window 31b of the enclosure 30 is reflected off the grating 62 via the prisms 63, 64, 65, and 66. The number of prisms disposed in the line narrowing module 60 is four in Comparative Example, and may instead be three or less or five or more as long as the prisms include at least one rotating prism, such as the prism 65.

Referring back to FIG. 2, the description of the gas laser apparatus 100 according to Comparative Example will be resumed. A laser resonator is formed by the output coupling mirror OC and the grating 62 so provided as to sandwich the enclosure 30, and the enclosure 30 is disposed on the optical path of the laser resonator. The light from the internal space of the enclosure 30 therefore travels back and forth between the grating 62 in the line narrowing module 60 and the output coupling mirror OC via the windows 31a and 31b and the prisms 63, 64, 65, and 66. The light traveling back and force is amplified whenever passing through a laser gain space between the electrodes 32a and 32b. Part of the amplified light passes through the output coupling mirror OC via the window 31a and exits as the pulse laser light.

The wavelength measuring module 20 is disposed on the optical path of the pulse laser light that exits via the output coupling mirror OC of the laser oscillator LO. The wavelength measuring module 20 includes an enclosure 21, a beam splitter 22, and a wavelength monitor 23. The enclosure 21 is connected to the optical path tube 51. An opening is formed in the enclosure 21, and an internal space of the enclosure 21 and the internal space of the optical path tube 51 communicate with each other via the opening. The beam splitter 22 and the wavelength monitor 23 are disposed in the internal space of the enclosure 21. The beam splitter 22 and the wavelength monitor 23 are optical elements on which the pulse laser light that exits via the output coupling mirror OC is incident.

The beam splitter 22 transmits the pulse laser light outputted from the laser oscillator LO at high transmittance and reflects part of the pulse laser light toward the light receiving surface of the wavelength monitor 23. The wavelength monitor 23 detects the wavelength of the pulse laser light incident on the light receiving surface and outputs data on the detected wavelength to the processor 70. The wavelength monitor 23 includes a spectrometer such as an etalon and an image sensor, and detects interference fringes generated by the etalon, for example, via the image sensor.

An opening is formed at the side, of the enclosure 21 of the wavelength measuring module 20, across the enclosure 21 from the side to which the optical path tube 51 is connected, and an optical path tube 53 is connected to the enclosure 21 so as to surround the opening. The internal space of the optical path tube 51, the internal space of the enclosure 21, and an internal space of the optical path tube 53 therefore communicate with each other. The optical path tube 53 is connected to the enclosure 10. A laser light exiting window OW is provided in the enclosure 10 at the position thereon surrounded by the optical path tube 53. The light passing through the beam splitter 22 of the wavelength measuring module 20 therefore exits out of the enclosure 10 through the optical path tube 53 and via the laser light exiting window OW.

The internal spaces of the optical path tubes 51, 52, and 53 and the enclosure 21 and 61 are filled with a purge gas. The purge gas contains an inert gas, such as high-purity nitrogen having a small amount of impurities, such as oxygen. The purge gas is supplied from a purge gas supply source that is not shown but is disposed outside the enclosure 10 into the internal spaces of the optical path tubes 51, 52, and 53 and the enclosures 21 and 61 through a pipe that is not shown.

A discharger that is not shown is disposed in the internal space of the enclosure 10 and discharges the laser gas discharged from the internal space of the enclosure 30 of the chamber apparatus CH. The discharger includes a halogen filter that removes the $F_2$ gas from the gas discharged from the internal space of the enclosure 30, and the discharger then outputs the resultant gas into the enclosure 10.

A fixing unit 300 that fixes the prism 65 to the mounter 65D will next be described.

Figure 5:
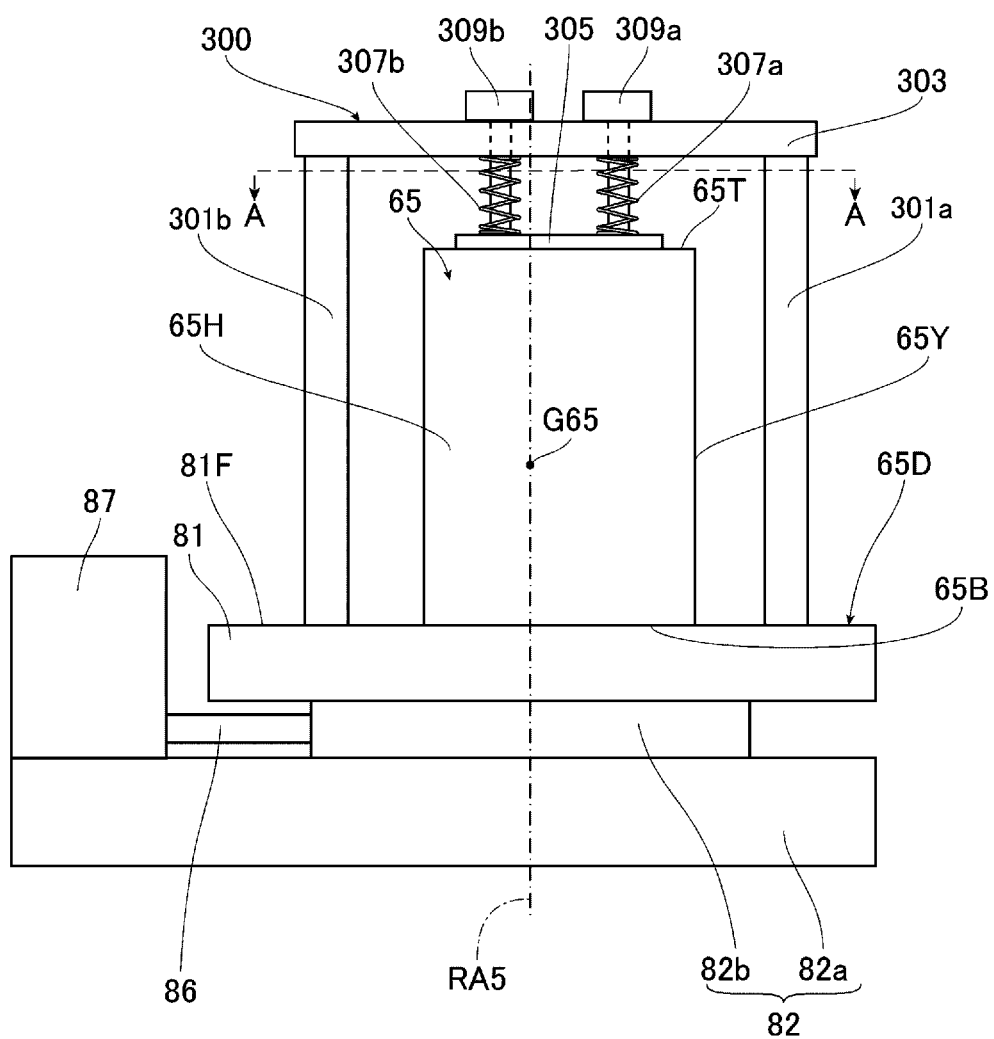
FIG. 5 shows that a prism is fixed by a fixing unit to a body section of a mounter, viewed in the direction perpendicular to a side surface of the prism.
Figure 6:
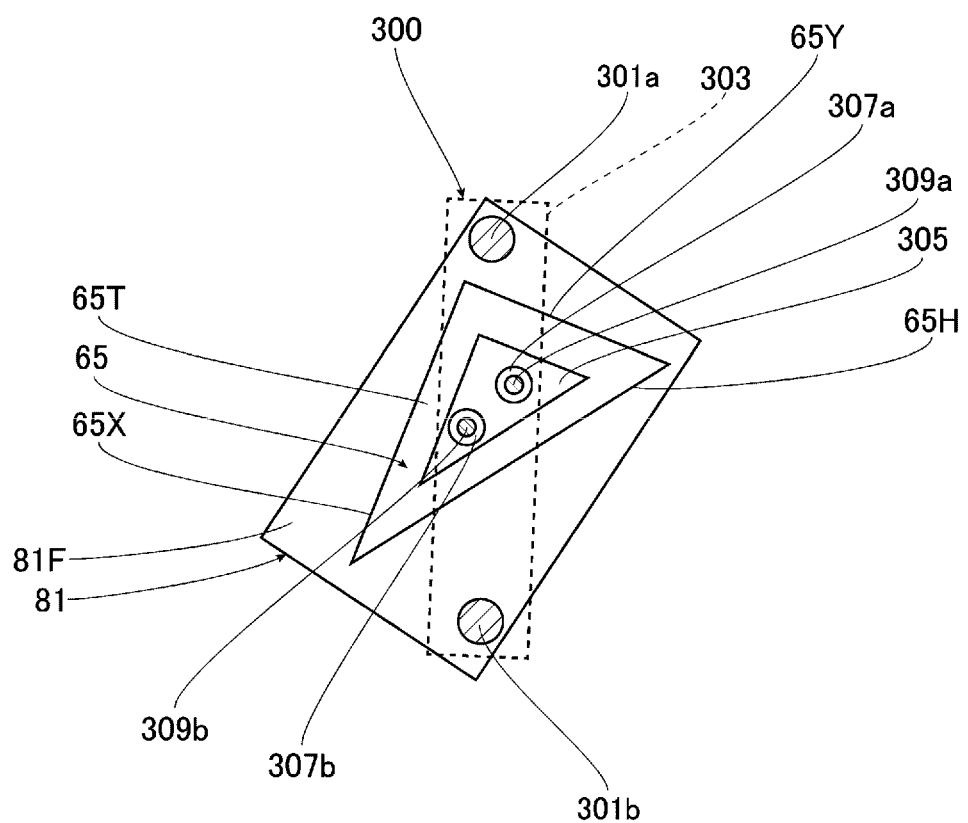
FIG. 6 is a cross-sectional view of the fixing unit taken along the line A-A shown in FIG. 5, viewed along the side surfaces of the prism from the side facing the lid section toward the bottom surface of the enclosure.

FIG. 5 shows that the prism 65 is fixed by the fixing unit 300 to a body section 81 of the mounter 65D, viewed in the direction perpendicular to the side surface 65H of the prism 65. FIG. 6 is a cross-sectional view of the fixing unit 300 taken along the line A-A shown in FIG. 5, viewed along the side surfaces of the prism 65 from the side facing the lid section 61L toward the bottom surface of the enclosure 61. In FIGS. 3 and 4, the fixing unit 300 is omitted for clarity of illustration. The body section 81 is a plate-shaped member, and has principal surfaces having a substantially rectangular shape, as shown in FIGS. 5 and 6. One principal surface of the body section 81 is a fixing surface 81F, to which the prism 65 is fixed.

The fixing unit 300 is disposed in the internal space of the enclosure 61. The fixing unit 300 includes a pair of pillar members 301a and 301b, a beam member 303, a plate member 305, and a pair of pressing members 307a and 307b, which are coiled springs. The fixing unit 300 further includes a pair of fixing members 309a and 309b, which are bolts having shafts around which the pair of pressing members 307a and 307b are wound.

The pillar members 301a and 301b are fixed to the fixing surface 81F. The pillar members 301a and 301b extend along the direction perpendicular to the fixing surface 81F to a position higher than the bottom surface 65T of the prism 65. The pillar members 301a and 301b therefore extend toward the side, having the bottom surface 65T as a reference, opposite from the bottom surface 65B. The pillar members 301a and 301b are disposed so as to sandwich the prism 65. The pillar members 301a and 301b are disposed in positions that deviate from the path along which the light incident on the light incident side surface of the prism 65 travels and the path along which the light that exits via the light exiting side surface of prism 65 travels, so that the pillar members 301a and 301b do not block the travel of the light. Specifically, the pillar members 301a and 301b are disposed in a region outside the region where the light travels to the light incident and exiting side surfaces of the prism 65. Each of the pillar members 301a and 301b has a circular columnar shape, but the shape thereof is not limited thereto.

The beam member 303 extends between the pillar members 301a and 301b at the ends, of the pillar members 301a and 301b, that are located at the side, having the bottom surface 65T as a reference, opposite from the bottom surface 65B. One end of the beam member 303 is fixed to the end of the pillar member 301a, and the other end of the beam member 303 is fixed to the end of the pillar member 301b. Since the pillar members 301a and 301b are longer than the prism 65 in the direction perpendicular to the fixing surface 81F, the beam member 303 is located above the bottom surface 65T. The beam member 303 is substantially parallel to the fixing surface 81F. The principal surfaces of the beam member 303 each have a substantially rectangular shape. In FIG. 6, the beam member 303 is drawn with the broken line.

The plate member 305 is disposed at the bottom surface 65T of the prism 65. The plate member 305 has a triangular columnar shape. The principal surfaces of the plate member 305 each have a shape similar to that of the bottom surface 65T, and the area of each of the principal surfaces of the plate member 305 is smaller than that of the bottom surface 65T.

The fixing members 309a and 309b pass through the beam member 303, and have ends that are in contact with the plate member 305.

The pressing members 307a and 307b are wound around the shafts of the fixing members 309a and 309b in such a way that the center axes of the pressing members 307a and 307b are coaxial with the center axes of the fixing members 309a and 309b. The pressing members 307a and 307b are extendable and contractable in the longitudinal direction thereof. The pressing members 307a and 307b are disposed between the plate member 305 and the beam member 303. The pressing members 307a and 307b extend toward the plate member 305 and press the plate member 305 toward the prism 65 with respect to the ends, of the pressing members 307a and 307b, that face the beam member 303.

The bottom surface 65B of the prism 65 is in contact with the fixing surface 81F with the fixing members 309a and 309b and the pressing members 307a and 307b being in contact with the plate member 305, which is placed at the bottom surface 65T of the prism 65. The elastic force produced by the pressing members 307a and 307b causes the plate member 305 to press the prism 65 toward the fixing surface 81F of the body section 81. The prism 65 is therefore sandwiched between the plate member 305 of the fixing unit 300 and the body section 81 of the mounter 65D with the prism 65 pressed against the fixing surface 81F by the plate member 305 and the pressing members 307a and 307b. The prism 65 is thus restricted in movement along the in-plane direction of the fixing surface 81F and fixed to the body section 81.

Fixing units 300 identical to the fixing unit 300 described above are further provided so as to fix the prisms 63, 64, and 66 to the mounters 63D, 64D, and 66D, respectively. The arrangement of the fixing units 300 with respect to the prisms 63, 64, and 66 and the mounters 63D, 64D, and 66D is the same as that of the fixing unit 300 with respect to the prism 65 and the body section 81 of the mounter 65D and will therefore not be described. The fixing units 300 for the prisms 63, 64, and 66 and the mounters 63D, 64D, and 66D are omitted in FIGS. 3 and 4 for clarity of illustration.

The mounter 65D will next be described. The mounter 65D includes the body section 81, which is a stage, and a rotation mechanism section 82. The body section 81 is fixed to the rotation mechanism section 82. The rotation mechanism section 82 in Comparative Example includes a fixed plate 82a and a rotary stage 82b. The body section 81 is fixed to the rotary stage 82b. The fixed plate 82a is fixed to the body section 61M of the enclosure 61. The rotary stage 82b is a circular-plate-shaped member that rotates in the in-plane direction of the principal surfaces of the fixed plate 82a around a predetermined axis. The fixed plate 82a and the rotary stage 82b are connected to each other, for example, via a cross roller bearing. The in-plane direction of the principal surfaces of the fixed plate 82a is parallel to the bottom surface 65B of the prism 65. An axis of rotation RA5 of the rotary stage 82b is therefore perpendicular to the dispersion plane of the light that exits out of the prism 65. When the rotary stage 82b rotates, the body section 81 fixed to the rotary stage 82b, the prism 65 fixed to the body section 81, and the fixing unit 300 rotate along with the rotary stage 82b around the axis of rotation RA5, which is perpendicular to the dispersion plane of the light that exits out of the prism 65.

The fixed plate 82a protrudes outward from the interior of the enclosure 61, as shown in FIG. 4. An enclosure 87 is provided at a portion, of the fixed plate 82a, outside the enclosure 61. The interior of the enclosure 87 is spatially connected to the interior of the enclosure 61 and form an airtight space. A stepper motor 84 is fixed to a portion, of the fixed plate 82a, outside the enclosure 61. The stepper motor 84 includes a predetermined shaft, and one end of the shaft is located inside the enclosure 87. The shaft moves along the longitudinal direction thereof when the stepper motor 84 operates.

A piezoelectric actuator 85 is movably disposed in the enclosure 87. The piezoelectric actuator 85 is in contact with the one end of the shaft of the stepper motor 84. Therefore, when the shaft of the stepper motor 84 moves, the piezoelectric actuator 85 moves.

A lever 86 is fixed to the rotary stage 82b. The lever 86 protrudes outward from the interior of the enclosure 61, and the end, of the lever 86, that is located at the side opposite from the rotary stage 82b is located in the enclosure 87. The piezoelectric actuator 85 is in contact with the lever 86. The piezoelectric actuator 85 is therefore sandwiched between the shaft of the stepper motor 84 and the lever 86, and when the piezoelectric actuator 85 operates, the piezoelectric effect changes the distance between the tip of the shaft of the stepper motor 84 and the lever 86. The side, of the lever 86, that is opposite from the side in contact with the piezoelectric actuator 85 is in contact with a plunger 89. The plunger 89 is fixed to the enclosure 87 and presses the lever 86. The lever 86 is therefore sandwiched between piezoelectric actuator 85 and the plunger 89, and is pressed by the piezoelectric actuator 85 and the plunger 89. The tilt of the lever 86 is changed by the movement of the piezoelectric actuator 85 caused by the operation of the stepper motor 84 and changes in the distance from the tip of the shaft of the stepper motor 84 to the lever 86 caused by the operation of the piezoelectric actuator 85. The change in the tilt of the lever 86 causes rotation of the rotary stage 82b. Therefore, in Comparative Example, the stepper motor 84 and the piezoelectric actuator 85 form a driving section that rotates the rotary stage 82b. The change in the tilt of the lever 86 caused by the operation of piezoelectric actuator 85 is smaller than the change in the tilt of the lever 86 caused by the operation of the stepper motor 84. That is, the stepper motor 84 is a driving section for coarse movement, and the piezoelectric actuator 85 is a driving section for fine movement. The optical path is therefore coarsely adjusted by the operation of the stepper motor 84, and finely adjusted by the operation of the piezoelectric actuator 85.

A driver 72 is electrically connected to the stepper motor 84 and the piezoelectric actuator 85. The driver 72 is electrically connected to the processor 70, which is electrically connected to the exposure apparatus 200 and the wavelength monitor 23. A signal relating to the wavelength of the light to be outputted by the gas laser apparatus 100 is inputted from the exposure apparatus 200 to the processor 70. A signal based on the intensity of the energy of the laser light received by the wavelength monitor 23 is further inputted from the wavelength monitor 23 to the processor 70. When the signals are inputted to the processor 70, the processor 70 outputs signals that drive the driver 72 to the driver 72 based on the signals, and when the signals from the processor 70 are inputted to the driver 72, the driver 72 drives the stepper motor 84 and the piezoelectric actuator 85.

2.2 Operation

The operation of the gas laser apparatus 100 according to Comparative Example will next be described.

In the state before the gas laser apparatus 100 outputs the laser light, the internal spaces of the optical path tubes 51, 52, and 53 and the internal spaces of the enclosures 21 and 61 are filled with the purge gas from the purge gas supply source, which is not shown. The laser gas supply source, which is not shown, supplies the internal space of the enclosure 30 with the laser gas. When the laser gas is supplied, the processor 70 controls the motor 38M to rotate the crossflow fan 38, and the rotation of the crossflow fan 38 circulates the laser gas.

When the gas laser apparatus 100 outputs the laser light, the processor 70 controls the charger BC and the switch in the pulse power module 35 to apply the high voltage to the space between the electrodes 32a and 32b. When the high voltage is applied to the space between the electrodes 32a and 32b, the insulation between the electrodes 32a and 32b is broken down and discharge occurs. The energy of the discharge excites the laser medium contained in the laser gas between the electrodes 32a and 32b, and the excited laser medium emits spontaneously emitted light when returning to the ground state. Part of the light is ultraviolet light and passes through the window 31b. The light having passed through the window 31b passes through the prisms 63, 64, 65, and 66, which magnify the light in the traveling direction of the light whenever the light passes through the prisms. Furthermore, the light is dispersed in terms of wavelength whenever passing through each of the prisms 63, 64, 65, and 66, and guided to the grating 62. The light is incident on the grating 62 at a predetermined angle and diffracted by the grating 62, and light having a predetermined wavelength is reflected off the grating 62 at an angle of reflection equal to the angle of incidence. The light reflected off the grating 62 propagates into the internal space of the enclosure 30 via the prisms 66, 65, 64, and 63, and the window 31b again. The linewidth of the light propagating into the internal space of the enclosure 30 has been narrowed. The narrowed-line light causes the excited laser medium to undergo stimulated emission, which amplifies the light. The light passes through the window 31a and travels to the output coupling mirror OC. Part of the light passes through the output coupling mirror OC, and the remainder of the light is reflected off the output coupling mirror OC, passes through the window 31a, and propagates into the internal space of the enclosure 30. The light having propagated into the internal space of the enclosure 30 passes through the window 31b and the prisms 63, 64, 65, and 66 and travels to the grating 62, as described above. The light having the predetermined wavelength thus travels back and forth in the space between the grating 62 and the output coupling mirror OC. The light is amplified whenever passing through the discharge space in the internal space of the enclosure 30, so that laser oscillation occurs. Part of the laser light then passes through the output coupling mirror OC and exits via the laser light exiting window OW.

Part of the laser light having passed through the output coupling mirror OC is reflected off the beam splitter 22. The reflected laser light is received by the wavelength monitor 23, which outputs a signal based on the intensity of the energy of the received laser light to the processor 70. The signal relating to the wavelength of the light has been inputted to the processor 70 from the exposure apparatus 200. The processor 70 therefore controls the driver 72 based on the signal inputted from the wavelength monitor 23 and the signal inputted from the exposure apparatus 200. The driver 72 thus drives the stepper motor 84 and the piezoelectric actuator 85. Driving the stepper motor 84 and the piezoelectric actuator 85 changes the tilt of the lever 86, causing rotation of the rotary stage 82b. The angle of the rotation, for example, ranges from −2.5 to +2.5 degrees. When the rotary stage 82b rotates, the body section 81 fixed to the rotary stage 82b and the prism 65 fixed to the body section 81 rotate along with the rotary stage 82b, so that the orientation of the prism 65 changes.

The change in the orientation of the prism 65 adjusts the wavelength of the light reflected off the grating 62 and returning into the enclosure 30 of the chamber apparatus CH. That is, the processor 70 adjusts the angle of rotation of the prism 65 based on the signal from the wavelength monitor 23 and the signal from the exposure apparatus 200 to perform feedback control in such a way that the wavelength of the light outputted from the gas laser apparatus 100 is equal to the wavelength required by the exposure apparatus 200.

2.3 Problems

In the gas laser apparatus 100 according to Comparative Example, when the light passes through, for example, the prisms 63, 64, 65, and 66, unexpected reflection of part of the light at the light incident side surfaces of the prisms 63, 64, 65, and 66 may produce scattered light. The scattered light may be reflected off the inner circumferential surface of the enclosure 61, and, for example, the fixing unit 300 that fixes the prism 65 may be irradiated with the scattered light. The fixing unit 300 that fixes the prism 65 may instead be directly irradiated with the scattered light from the prisms 64 and 66. The fixing unit 300 that fixes the prism 65 has been described, and the fixing units 300 that fix the prisms 63, 64, and 66 may also be irradiated with the scattered light from the other prisms. When the fixing unit 300 is irradiated with the scattered light, the fixing unit 300 undesirably heats up and thermally expands. In this case, the fixing unit 300 is deformed due to the thermal expansion, and the prism 65 may tilt due to the deformation of the fixing unit 300. In this case, the traveling direction of the light outputted from the gas laser apparatus 100 may change over time.

To avoid the situation described above, another gas laser apparatus 100 is presented by way of example in embodiments described below, the gas laser apparatus 100 capable of suppressing changes over time in the traveling direction of the light outputted from the gas laser apparatus 100 by suppressing the irradiation of the fixing unit 300 with the scattered light.

The embodiments below will be described with reference to the fixing unit 300 that fixes the prism 65, and the same effects and advantages as those provided by the fixing unit 300 that fixes the prism 65 can be provided by the fixing units 300 that fix the prisms 63, 64, and 66.

3. Description of Line Narrowing Module According to First Embodiment

The line narrowing module 60 according to a first embodiment will next be described. The same components as those described above have the same reference characters, and duplicate description of the same components will be omitted unless otherwise specified.

3.1 Configuration

Figure 7:
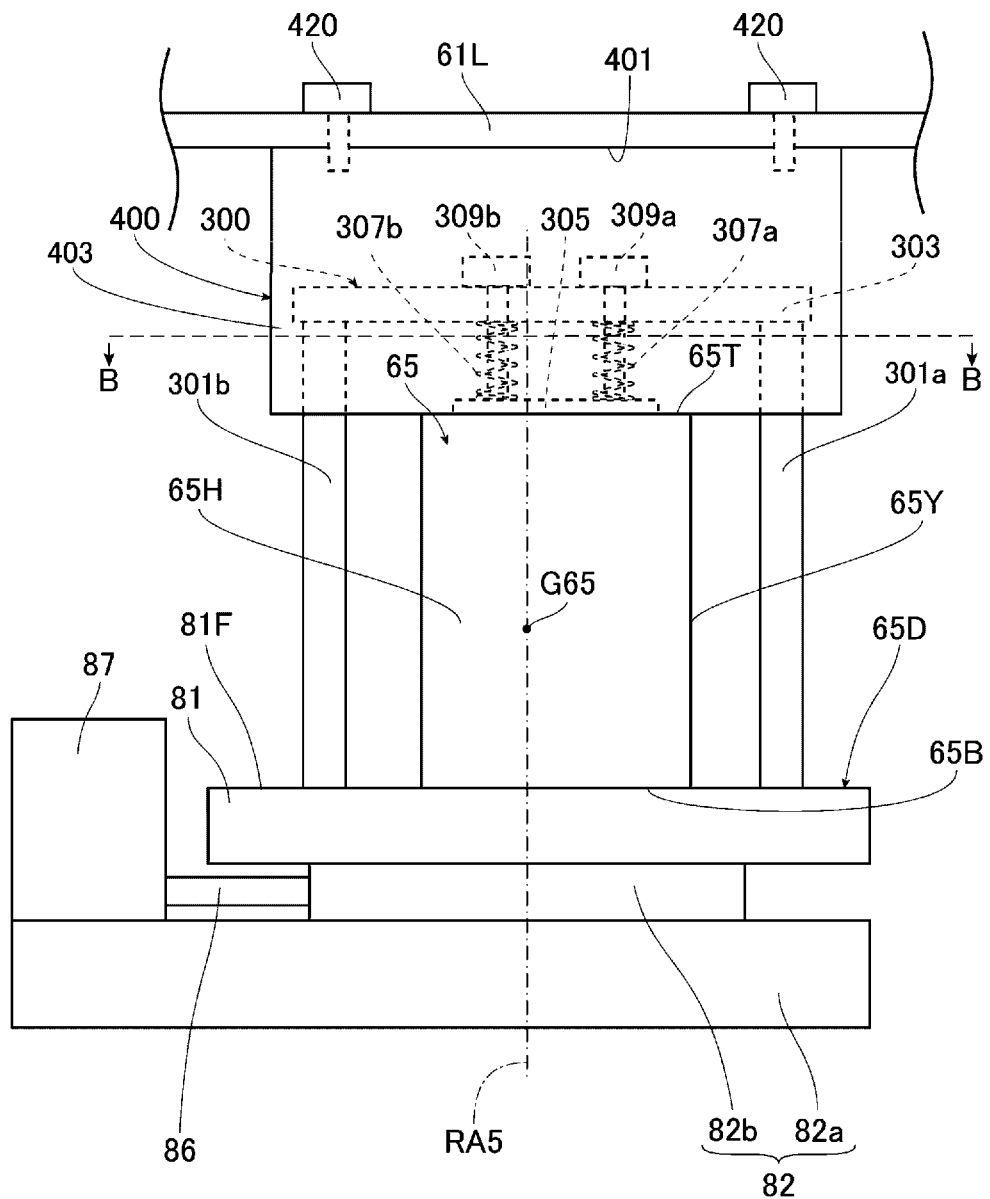
FIG. 7 shows a light blocking member in a first embodiment that surrounds the fixing unit shown in FIG. 5.

FIG. 7 shows a light blocking member 400 in the first embodiment, which surrounds the fixing unit 300 shown in FIG. 5. The line narrowing module 60 according to the first embodiment differs from the line narrowing module 60 in Comparative Example in that the light blocking member 400 is further provided and blocks the scattered light traveling to the fixing unit 300 that fixes the prism 65, as shown in FIG. 7. The light blocking member 400 surrounds the fixing unit 300, and the portion, of the fixing unit 300, that is surrounded by the light blocking member 400 is drawn with the broken lines in FIG. 7.

The light blocking member 400 is disposed in the internal space of the enclosure 61. The light blocking member 400 is a tubular member having one end closed. The light blocking member 400 therefore includes an upper wall 401, which is fixed to the lid section 61L, and a sidewall 403, which extends from the circumferential edge of the upper wall 401 toward the body section 81 and is integrated with the upper wall 401. The thus configured light blocking member 400 has an open bottom surface on the side opposite from the upper wall 401.

The upper wall 401 of the light blocking member 400 is fixed to the lid section 61L of the enclosure 61 by fixing members 420, which are bolts, with the upper wall 401 being in contact with the lid section 61L, and the light blocking member 400 is suspended from the lid section 61L toward the body section 81. In the thus configured light blocking member 400, the sidewall 403 extends from the lid section 61L toward the fixing surface 81F at least beyond the head portions of the fixing members 309a and 309b. The sidewall 403 preferably extends so as to be flush with the bottom surface 65T. The sidewall 403 of the light blocking member 400 therefore surrounds the entire circumferential portion, of the fixing unit 300, that is located on the side, having the bottom surface 65T as a reference, that is opposite from the bottom surface 65B. The portion described above is a portion of the fixing unit 300 including portions, of the pillar members 301a and 301b, that are located on the side, having the bottom surface 65T as a reference, that is opposite from the bottom surface 65B, and the beam member 303, the plate member 305, the pressing members 307a and 307b, and the fixing members 309a and 309b. The remainder, of the pillar members 301a and 301b, that is located closer to the bottom surface 65B than the bottom surface 65T is to the bottom surface 65B, and the side surfaces 65H, 65X, and 65Y of the prism 65 are therefore not surrounded by the light blocking member 400 but are exposed. The sidewall 403 is located between the portion described above and the inner circumferential surface of the enclosure 61 and is closer to the portion described above than to the inner circumferential surface. The light blocking member 400 described above blocks the scattered light before the scattered light reaches the portion of the fixing unit 300 because the sidewall 403 of the light blocking member 400 is irradiated with the scattered light before the scattered light reaches the portion of the fixing unit 300.

The light blocking member 400 is made, for example, of metal having high thermal conductivity, such as stainless steel, aluminum, or copper. The light blocking member 400 conducts the heat generated by the scattered light with which the light blocking member 400 is irradiated to the lid section 61L.

Figure 8:
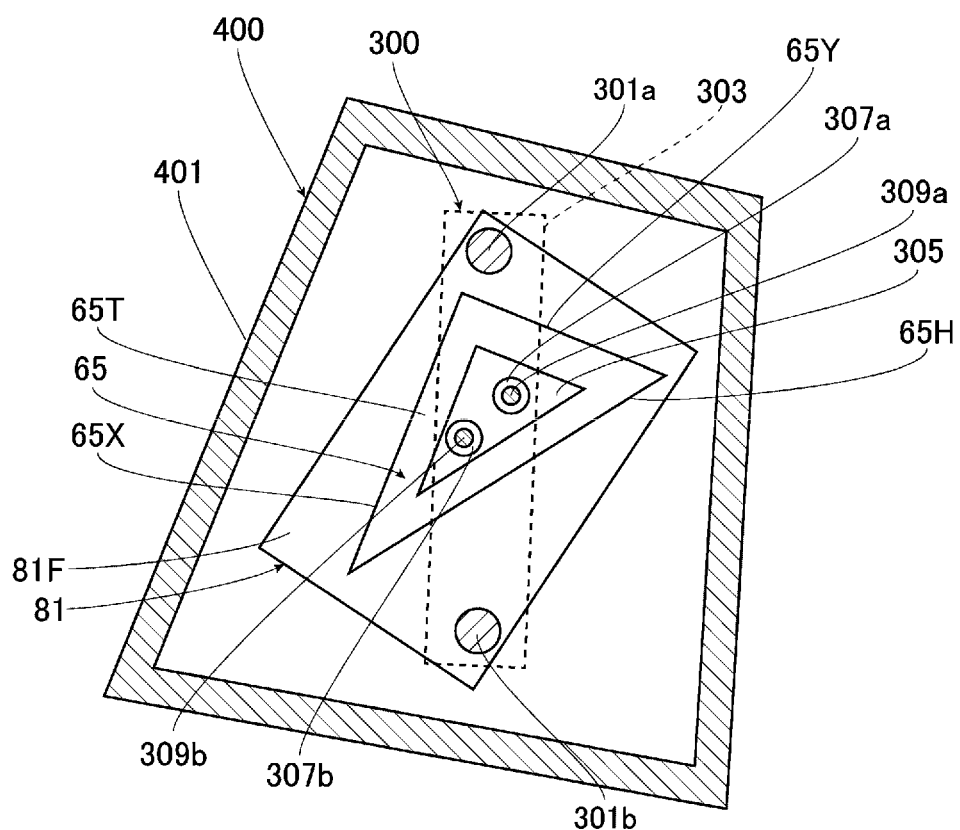
FIG. 8 is a cross-sectional view of the fixing unit and the light blocking member taken along the line B-B shown in FIG. 7, viewed along the side surfaces of the prism from the side facing the lid section toward the bottom surface of the enclosure.

FIG. 8 is a cross-sectional view of the fixing unit 300 and the light blocking member 400 taken along the line B-B shown in FIG. 7, viewed along the side surfaces of the prism 65 from the side facing the lid section 61L toward the bottom surface of the enclosure 61. In FIG. 8, the beam member 303 is drawn with the broken line, as in FIG. 6. The outer shape of the sidewall 403 and the shape of the upper wall 401 are each, for example, a trapezoid, but not necessarily. The outer shape of the sidewall 403 and the upper wall 401 are larger than the body section 81, the prism 65, and the fixing unit 300. Therefore, even when the prism 65 and the fixing unit 300 are rotated by the rotation mechanism section 82 via the body section 81, the sidewall 403 does not come into contact with the prism 65, the body section 81, and the fixing unit 300.

3.2 Effects and Advantages

In the line narrowing module 60 according to the present embodiment, the light blocking member 400 blocks the scattered light traveling to the fixing unit 300 before the scattered light reaches the portion of the fixing unit 300.

When the light blocking member 400 blocks the scattered light, irradiation of the fixing unit 300 with the scattered light is suppressed, so that the thermal expansion of the fixing unit 300 due to the scattered light is suppressed. When thermal expansion is suppressed, the deformation of the fixing unit 300 is suppressed, so that the tilt of the prism 65 due to the deformation is suppressed. The suppression of the tilt suppresses the changes over time in the traveling direction of the light outputted from the gas laser apparatus 100.

The scattered light not only travels at the same height position as that of the light traveling to the light incident side surfaces of the prisms 63, 64, 65, and 66, but also travels toward positions lower or higher than the position described above. The scattered light is also produced at the light exiting side surfaces of the prisms 63, 64, 65, and 66 when the light exits via the light exiting side surfaces. Out of the light traveling through the interiors of the prisms 63, 64, 65, and 66, part of the light may be reflected off the light exiting surfaces toward the side surfaces 63Y, 64Y, 65Y, and 66Y. When the light travels to the side surfaces 63Y, 64Y, 65Y, and 66Y and exits via the side surfaces 63Y, 64Y, 65Y, and 66Y, scattered light may be produced. The scattered light described above travels to the fixing units 300 in a variety of directions. The light blocking member 400 in the present embodiment surrounds the fixing unit 300 and can therefore block the scattered light traveling to the fixing unit 300 in a variety of directions. The light blocking member 400 in the present embodiment surrounds the fixing unit 300 irradiated with the scattered light by the greatest degrees out of the plurality of fixing units 300, whereby the change over time in the traveling direction of the light outputted from the gas laser apparatus 100 can be suppressed as compared with a case where the light blocking member 400 surrounds any of the other fixing units 300.

In the line narrowing module 60 according to the present embodiment, the light blocking member 400 surrounds the portion, of the fixing unit 300, that is located on the side, having the bottom surface 65T as a reference, that is opposite from the bottom surface 65B. The portion described above includes portions, of the pillar members 301a and 301b, that are located on the side, having the bottom surface 65T as a reference, that is opposite from the bottom surface 65B, the beam member 303, the plate member 305, the pressing members 307a and 307b, and the fixing members 309a and 309b. The light blocking member 400 thus blocks the scattered light traveling to the portion described above without obstructing the travel of the light incident on the light incident side surface of the prism 65 and the travel of the light exiting via the light exiting side surface of the prism 65. The deformation of the portion described above can therefore be suppressed without obstruction of the travel of the light, whereby the tilt of the prism 65 due to the deformation can be suppressed.

In the line narrowing module 60 according to the present embodiment, the light blocking member 400 is fixed to the enclosure 61. Therefore, even when the light blocking member 400 generates heat due to the scattered light with which the light blocking member 400 is irradiated, the heat is transferred from the light blocking member 400 to the enclosure 61. When the heat is transferred to the enclosure 61, a rise in the temperature of an internal space of the light blocking member 400 in which the fixing unit 300 is located is suppressed, so that the thermal expansion of the fixing unit 300 due to the rise in the temperature can be suppressed.

In the line narrowing module 60 according to the present embodiment, the light blocking member 400 is made of metal. The heat is thus readily transferred from the light blocking member 400 to the enclosure 61.

In the line narrowing module 60 according to the present embodiment, the metal is stainless steel, aluminum, or copper. The heat is thus more readily transferred from the light blocking member 400 to the enclosure 61 than in a case where the light blocking member 400 is made of metal other than those described above.

In the line narrowing module 60 according to the present embodiment, a nickel plated layer that absorbs at least part of light having the same wavelength as that of the scattered light may be disposed at the light blocking member made of aluminum.

The volume of the mounter 65D including the body section 81 in the present embodiment is greater than the total volume of the members of the fixing unit 300, so that the thermal capacity of the mounter 65D is greater than the thermal capacity of the fixing unit 300. Therefore, even when the mounter 65D is irradiated with the scattered light, the mounter 65D is more unlikely to thermally expand than the fixing unit 300 and is therefore more unlikely to be deformed than the fixing unit 300. Since the mounter 65D is unlikely to be deformed, the tilt of the prism 65 due to the deformation can be suppressed.

Figure 9:
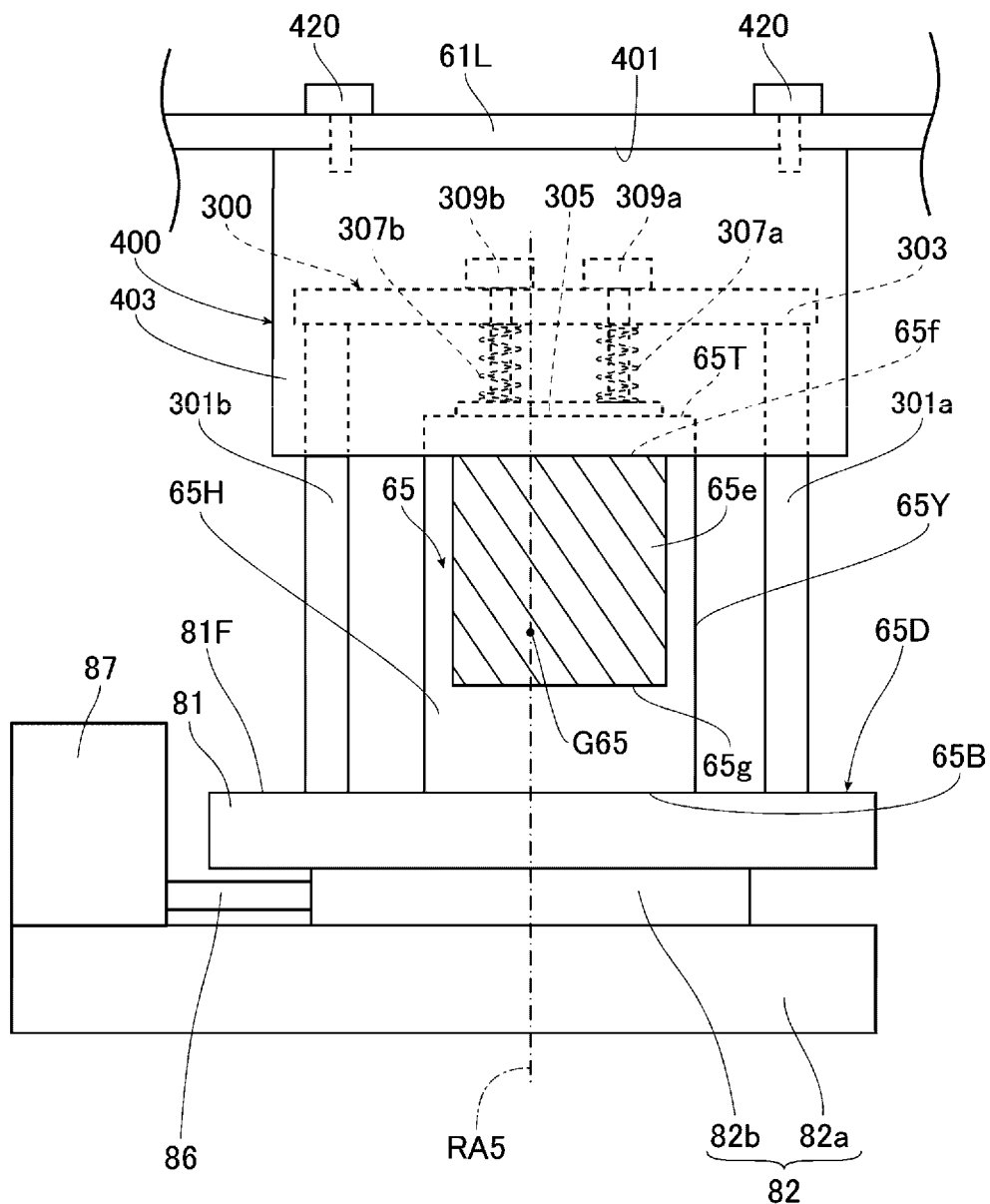
FIG. 9 shows the light blocking member in a variation of the first embodiment, which surrounds the fixing unit shown in FIG. 5.

In the light blocking member 400 according to the present embodiment, specifically, the sidewall 403 surrounds the entire circumferential portion, of the fixing unit 300, that is located on the side, having the bottom surface 65T as a reference, that is opposite from the bottom surface 65B, but not necessarily. FIG. 9 shows the light blocking member 400 in a variation of the first embodiment, which surrounds the fixing unit 300 shown in FIG. 5. The light does not enter the prism 65 via the entire light incident side surface thereof, for example, the entire side surface 65H, but enters the prism 65 via a region of the light incident side surface. The region is referred to as a light incident region 65e and hatched in FIG. 9. Furthermore, the light does not exit out of the prism 65 via the entire light exiting side surface thereof, but exits via a region of the light exiting side surface. The region is referred to as a light exiting region. When the light incident side surface is the side surface 65H, the light exiting side surface is the side surface 65X, and the light exiting region is a portion of the side surface 65X. The light incident region 65e and the light exiting region are arranged so as to face each other via the prism 65 and are substantially at the same position in the height direction. The sidewall 403 of the light blocking member 400 may surround a portion, of the fixing unit 300, that is located on the side, having an upper edge 65f of the light incident region 65e and the upper edge of the light exiting region as a reference, that is opposite from a lower edge 65g of the light incident region 65e and the lower edge of the light exiting region. The upper edges are located in positions closer to the bottom surface 65B of the prism 65 than the bottom surface 65T of the prism 65 is to the bottom surface 65B. The portion described above is a portion of the fixing unit 300 including a portion, of the pillar members 301a and 301b, that is located on the side, having the upper edges as a reference, that is opposite from the lower edges, and the beam member 303, the plate member 305, the pressing members 307a and 307b, and the fixing members 309a and 309b. FIG. 9 shows the portions, of the prism 65 and the fixing unit 300, that are surrounded by the light blocking member 400 with the broken lines. As a result, the light blocking member 400 does not obstruct the travel of the light incident on the light incident region 65e of the prism 65 and the light exiting via the light exiting region of the prism 65 but blocks more scattered light than in the case where the portion, of the fixing unit 300, that is located on the side, having the bottom surface 65T as a reference, that is opposite from the bottom surface 65B. The thermal expansion of the fixing unit 300 due to the scattered light can therefore be further suppressed, whereby the deformation of the fixing unit 300 can be more suppressed.

The light blocking member 400 surrounds the entire circumference of the fixing unit 300, and may instead surround at least a portion of the fixing unit 300. Therefore, for example, a cutout may be provided at a portion of the light blocking member 400, and the light blocking member 400 may surround a circumferential portion, of the fixing unit 300, around the center axis thereof but may not surround the remainder of the fixing unit 300. In this case, in a transverse cross-section of the light blocking member 400, a straight line that connects two ends, of the light blocking member 400, in the direction around the center axis of the light blocking member 400 passes through the center axis of the fixing unit 300. Instead, in the transverse cross-section of the light blocking member 400, the straight line that connects the two ends of the light blocking member 400 may pass through a region, of the fixing unit 300, outside the center axis of the fixing unit 300. The light blocking member 400 that surrounds only the portion of the fixing unit 300 can thus still block the scattered light.

Figure 10:
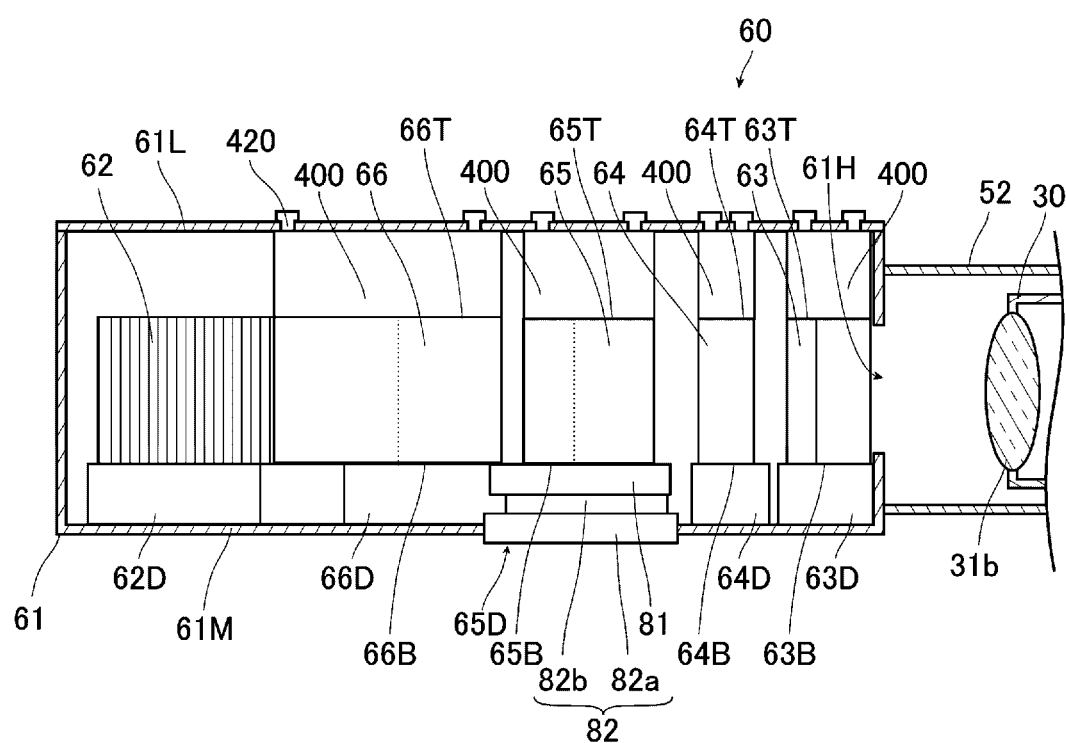
FIG. 10 is an enlarged view of the line narrowing module according to the variation of the first embodiment.

In the line narrowing module 60 according to the present embodiment, the light blocking member 400 surrounds the fixing unit 300 that fixes the prism 65, but not necessarily. For example, the light blocking member 400 may individually surround the fixing unit 300 that fixes any of the other prisms 63, 64, and 66 other than the prism 65. Still instead, the number of disposed light blocking members 400 may be set equal to the number of fixing units 300 that separately fix the prisms 63, 64, 65, and 66 disposed in the internal space of the enclosure 61 of the line narrowing module 60, and the light blocking members 400 may separately surround the fixing units 300, which fix the prisms 63, 64, 65, 66, as shown in FIG. 10. In FIG. 10, the fixing units 300 are omitted, as in FIG. 3. In FIG. 10, only one fixing member 420 is labeled with the reference character, and the other fixing members 420 are not labeled with the reference characters for clarity. Instead, one light blocking member may collectively surround the fixing units 300 that fix the prisms 63, 64, 65, and 66. Still instead, one light blocking member may collectively surround the fixing units 300 that fix adjacent ones of the prisms 63, 64, 65, and 66.

4. Description of Line Narrowing Module According to Second Embodiment

The line narrowing module 60 according to a second embodiment will next be described. The same components as those described above have the same reference characters, and duplicate description of the same components will be omitted unless otherwise specified.

4.1 Configuration

Figure 11:
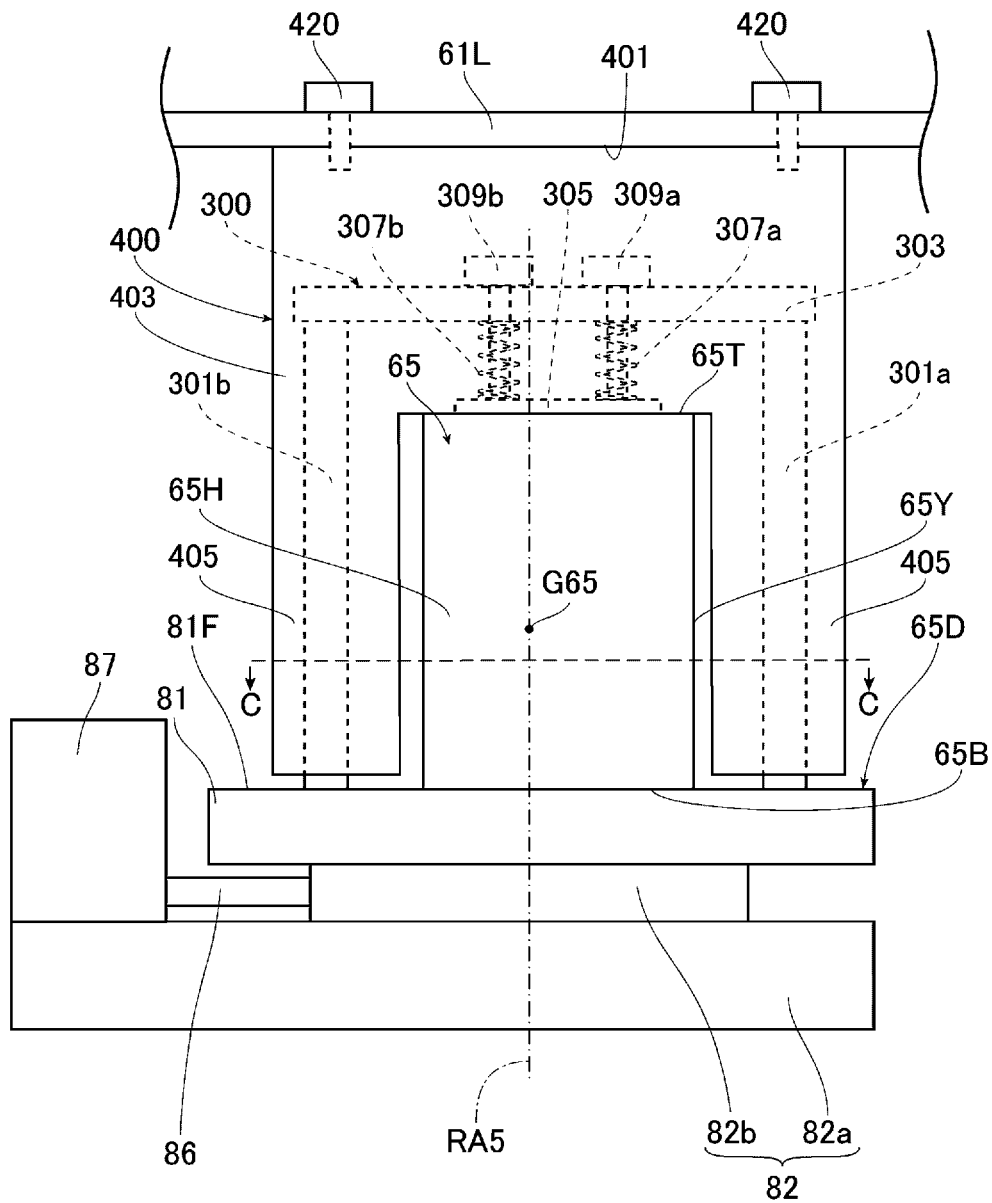
FIG. 11 shows the light blocking member in a second embodiment that surrounds the fixing unit shown in FIG. 5.

FIG. 11 shows the light blocking member 400 in the second embodiment, which surrounds the fixing unit 300 shown in FIG. 5. FIG. 11 shows the portions, of the fixing unit 300, that are surrounded by the light blocking member 400 with the broken lines. The line narrowing module 60 according to the present embodiment differs from the line narrowing module 60 according to the first embodiment in that the light blocking member 400 further surrounds the portions, of the pillar members 301a and 301b, that are located closer to the bottom surface 65B than the bottom surface 65T to the bottom surface 65B, as shown in FIG. 11.

The sidewall 403 of the light blocking member 400 includes a pair of extending sections 405, which extend from the bottom surface 65T toward the bottom surface 65B. The extending sections 405 extend substantially across the pillar members 301a and 301b. To prevent the extending sections 405 and the fixing surface 81F from being in contact with each other when the body section 81 is rotated by the rotation mechanism section 82, the ends of the extending sections 405 are disposed so as to be slightly separate from the fixing surface 81F.

Figure 12:
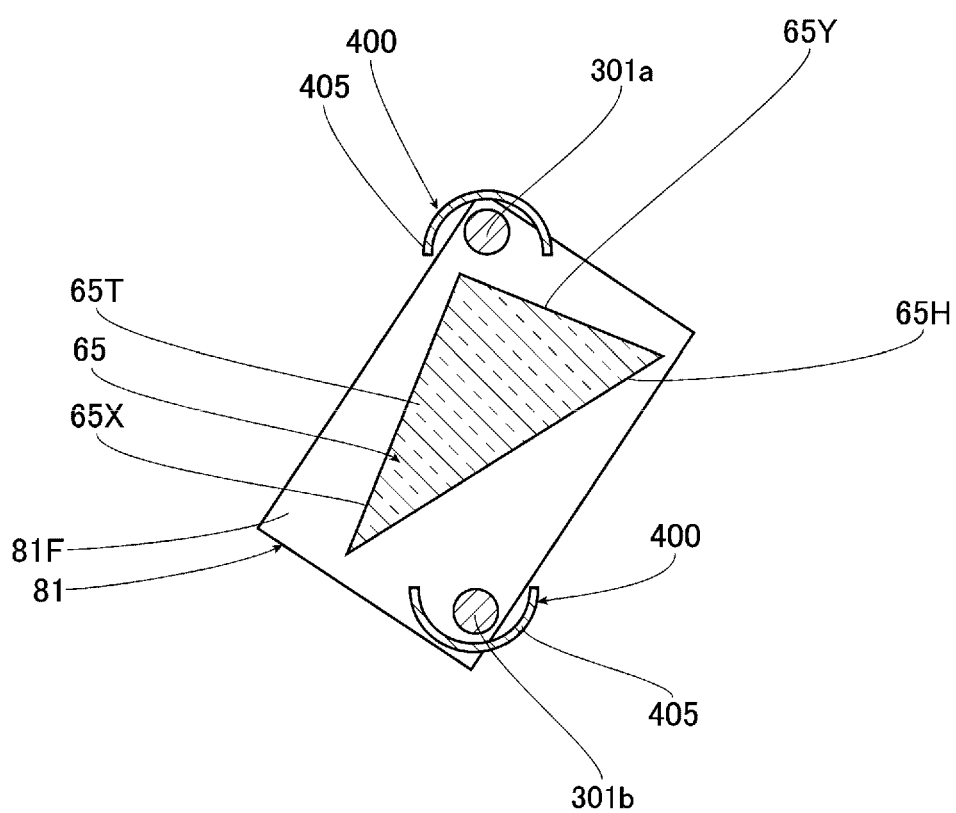
FIG. 12 is a cross-sectional view of the prism, the fixing unit, and the light blocking member taken along the line C-C shown in FIG. 11, viewed along the side surfaces of the prism from the side facing the lid section toward the bottom surface of the enclosure.

FIG. 12 is a cross-sectional view of the prism 65, the fixing unit 300, and the light blocking member 400 taken along the line C-C shown in FIG. 11, viewed along the side surfaces of the prism 65 from the side facing the lid section 61L toward the bottom surface of the enclosure 61. The extending sections 405 each have, for example, a C-letter shape, as shown in FIG. 12, but not necessarily. One of the extending sections 405 that surrounds the pillar member 301a surrounds a portion, of the outer circumferential surface the pillar member 301a, other than the outer circumferential surface facing the outer circumferential surface of the pillar member 301b via the prism 65. Therefore, the one extending section 405 is located on the side across the pillar member 301a from a portion of the prism 65 located on the line that connects the pillar member 301a and the pillar member 301b to each other, and surrounds a portion, of the outer circumference surface of the pillar member 301a, that faces the side, of the pillar member 301a, that is opposite from the prism 65. When the pillar member 301b is viewed from the side facing the one extending section 405 via the pillar member 301a and the prism 65, the pillar member 301a is covered by and hidden behind the one extending section 405. The one extending section 405 is disposed so as to be separate from the pillar member 301a in such a way that the pillar member 301a does not come into contact with the extending section 405 when the pillar member 301a is rotated by the rotation mechanism section 82 via the body section 81 as described above. In a transverse cross-section of the one extending section 405, the straight line that connects two ends of the light blocking member 400 passes through a region, of the pillar member 301a, shifted toward the prism 65 from the center axis of the pillar member 301a. The description has been made with reference to the extending section 405 facing the pillar member 301a, and the same holds true for the extending section 405 facing the pillar member 301b.

4.2 Effects and Advantages

In the line narrowing module 60 according to the present embodiment, the extending sections 405 of light blocking member 400 surround the portions, of the pillar members 301a and 301b, that are located closer to the bottom surface 65B than the bottom surface 65T is to the bottom surface 65B. The extending sections 405 thus block the scattered light traveling to the portions. When the extending sections 405 block the scattered light, the thermal expansion of the pillar members 301a and 301b due to the scattered light can be further suppressed, so that deformation of the pillar members 301a and 301b can be further suppressed.

In a transverse cross-section of the extending sections 405, the straight line that connects two ends of the extending section 405 facing the pillar member 301a may pass through the center axis thereof. The extending section 405 facing the pillar member 301a may instead surround the entire circumference thereof. The description has been made with reference to the pillar member 301a, and the same holds true for the pillar member 301b.

The extending sections 405 may be in contact with the fixing surface 81F. Therefore, even when the extending sections 405 generate heat due to the scattered light with which the extending sections 405 are irradiated, the heat is transferred from the extending sections 405 to the mounter 65D via the fixing surface 81F. Therefore, a rise in the temperature of the space inside the extending sections 405, where the pillar members 301a and 301b are located, can be suppressed, whereby the thermal expansion of the pillar members 301a and 301b due to the rise in the temperature can be suppressed.

The light blocking member 400 in the present embodiment is not necessarily fixed to the lid section 61L, and may instead be fixed to the fixing surface 81F.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A line narrowing module comprising:
   an enclosure;
   a prism which is disposed in an internal space of the enclosure and through which light passes;
   a mounter which is disposed in the internal space and on which the prism is mounted;
   a fixing unit which is disposed in the internal space and fixes the prism to the mounter; and
   a light blocking member which is disposed in the internal space and blocks scattered light in the internal space, the scattered light produced from the light and traveling to the fixing unit.

2. The line narrowing module according to claim 1, wherein the light blocking member surrounds at least a portion of the fixing unit.

3. The line narrowing module according to claim 1, wherein the fixing unit includes
   a pair of pillar members that are disposed in positions that deviate from a path along which the light incident on a light incident side surface of the prism travels and a path along which the light that exits via a light exiting side surface of the prism travels, and further disposed at the mounter so as to sandwich the prism having one bottom surface and another bottom surface, the pair of pillar members extending to a position higher than the other bottom surface on a side across the prism from the one bottom surface mounted on the mounter,
   a beam member disposed on a side, having the other bottom surface as a reference, opposite from the one bottom surface and extending between the pair of pillar members,
   a plate member mounted on the other bottom surface, and
   a pressing member disposed between the beam member and the plate member and pressing the plate member toward the prism, and
   the light blocking member surrounds a portion, of the fixing unit, on a side, having the other bottom surface as a reference, opposite from the one bottom surface.

4. The line narrowing module according to claim 3, wherein the light blocking member further surrounds portions, of the pillar members, that are closer to the one bottom surface than the other bottom surface to the one bottom surface.

5. The line narrowing module according to claim 4, wherein the light blocking member surrounds an outer circumference surface, of each of the pillar members, on a side across the pillar member from the prism.

6. The line narrowing module according to claim 1, wherein the fixing unit includes
   a pair of pillar members that are disposed in positions that deviate from a path along which the light incident on a light incident side surface of the prism travels and a path along which the light that exits via a light exiting side surface of the prism travels, and further disposed at the mounter so as to sandwich the prism having one bottom surface and another bottom surface, the pair of pillar members extending to a position higher than the other bottom surface on a side across the prism from the one bottom surface mounted on the mounter,
   a beam member disposed on a side, having the other bottom surface as a reference, opposite from the one bottom surface and extending between the pair of pillar members,
   a plate member mounted on the other bottom surface, and
   a pressing member disposed between the beam member and the plate member and pressing the plate member toward the prism,
   the light incident side surface and the light exiting side surface each has a region where the light travels, and
   the light blocking member surrounds a portion, of the fixing unit, on a side, having an upper edge of the region as a reference, opposite from a lower edge of the region.

7. The line narrowing module according to claim 6, wherein the light blocking member further surrounds portions, of the pillar members, that are closer to the one bottom surface than the other bottom surface to the one bottom surface.

8. The line narrowing module according to claim 7, wherein the light blocking member surrounds an outer peripheral surface, of each of the pillar members, on a side across the pillar member from the prism.

9. The line narrowing module according to claim 1, wherein the light blocking member is fixed to the enclosure.

10. The line narrowing module according to claim 9, wherein the light blocking member is made of metal.

11. The line narrowing module according to claim 10, wherein the metal includes stainless steel, aluminum, or copper.

12. The line narrowing module according to claim 11, wherein when the metal is the aluminum, a nickel plated layer is disposed at a portion, of the light blocking member, to be irradiated with the scattered light.

13. The line narrowing module according to claim 1, further comprising a rotation mechanism section that rotates the mounter along with the prism around an axis perpendicular to a dispersion plane of the light that exits out of the prism.

14. The line narrowing module according to claim 1, wherein the prism, the mounter, the fixing unit, and the light blocking member are formed of a plurality of prisms, a plurality of mounters, a plurality of fixing units, and a plurality of light blocking members, and the light blocking members individually surround the respective fixing units.

15. A gas laser apparatus comprising a line narrowing module,
the line narrowing module includes
an enclosure,
a prism which is disposed in an internal space of the enclosure and through which light passes,
a mounter which is disposed in the internal space and on which the prism is mounted,
a fixing unit which is disposed in the internal space and fixes the prism to the mounter, and
a light blocking member which is disposed in the internal space and blocks scattered light in the internal space, the scattered light produced from the light and traveling to the fixing unit.

16. An electronic device manufacturing method comprising:
causing laser light outputted from a gas laser apparatus including a line narrowing module to enter an exposure apparatus,
the line narrowing module including
an enclosure,
a prism which is disposed in an internal space of the enclosure and through which light passes,
a mounter which is disposed in the internal space and on which the prism is mounted,
a fixing unit which is disposed in the internal space and fixes the prism to the mounter, and
a light blocking member which is disposed in the internal space and blocks scattered light in the internal space, the scattered light produced from the light and traveling to the fixing unit, and
causing a light sensitive substrate to be exposed to the laser light in the exposure apparatus to manufacture electronic devices.

* * * * *